United States Patent
Yoshida

(10) Patent No.: US 7,922,882 B2
(45) Date of Patent: Apr. 12, 2011

(54) SUBSTRATE HOLDING DEVICE, SUBSTRATE PROCESSING SYSTEM AND LIQUID CRYSTAL DISPLAY DEVICE

(75) Inventor: Yasuzou Yoshida, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 1026 days.

(21) Appl. No.: 11/665,830

(22) PCT Filed: Nov. 17, 2005

(86) PCT No.: PCT/JP2005/021162
§ 371 (c)(1),
(2), (4) Date: Apr. 20, 2007

(87) PCT Pub. No.: WO2006/054663
PCT Pub. Date: May 26, 2006

(65) Prior Publication Data
US 2007/0292632 A1 Dec. 20, 2007

(30) Foreign Application Priority Data
Nov. 22, 2004 (JP) ................. 2004-337222

(51) Int. Cl.
*C23C 14/35* (2006.01)
*C23C 16/00* (2006.01)
(52) U.S. Cl. ............... 204/298.15; 204/298.25; 118/728; 118/729; 118/668; 118/669
(58) Field of Classification Search ............. 204/298.25, 204/298.15; 118/668, 669, 728, 729
See application file for complete search history.

(56) References Cited

U.S. PATENT DOCUMENTS

| 4,944,860 | A | 7/1990 | Bramhall, Jr. et al. |
| 2004/0218193 | A1 | 11/2004 | Kurita et al. |

FOREIGN PATENT DOCUMENTS

| JP | 2-179874 A | 7/1990 |
| JP | 4-193951 A | 7/1992 |
| JP | 7-34221 A | 2/1995 |
| JP | 2000-290784 A | 10/2000 |
| JP | 2002-20856 A | 1/2002 |
| JP | 2002-121663 A | 4/2002 |
| JP | 2002-176090 A | 6/2002 |
| JP | 2002-309372 A | 10/2002 |
| JP | 2004-260175 A | 9/2004 |

*Primary Examiner* — Rodney G McDonald
(74) *Attorney, Agent, or Firm* — Birch, Stewart, Kolasch & Birch, LLP

(57) ABSTRACT

In holding a substrate p loaded at a specified position on a holder 30 by clamping a peripheral region of the substrate p against the holder 30 through a plurality of engagement elements 32, it can be avoided that when the substrate p is offset from the specified position and its peripheral region gets on one or some of the engagement elements 32, the substrate p is processed with the peripheral region getting on the engagement element 32.

A substrate holding device includes: a plurality of detector sensors 80 for detecting the peripheral region of the substrate p if the substrate p is placed at the specified position on the holder 30; and a determination unit 90 for determining that the substrate p is offset from the specified position when at least one of the detector sensors 80 did not detect the associated part of the substrate p.

6 Claims, 9 Drawing Sheets

SUBSTRATE HOLDING DEVICE, SUBSTRATE PROCESSING SYSTEM AND LIQUID CRYSTAL DISPLAY DEVICE

TECHNICAL FIELD

This invention relates to a substrate holding device allowing a substrate placed at a specified position on a holder, such as a pallet, to be held by the holder in a substrate processing system, such as a sputtering system for depositing a film on the substrate held by the holder, and particularly relates to measures to avoid inconveniences due to the placement of the substrate offset from the specified position on the holder.

BACKGROUND ART

As disclosed in Patent Document 1, for example, a sputtering system used to deposit a specified thin film on a substrate in manufacturing a TFT array substrate for a liquid crystal display device includes a palletizer built thereinto to allow a substrate placed on a substantially horizontally positioned pallet to be held by the pallet. In such a sputtering system, a technique is known for transferring the pallet to a reaction chamber with the pallet raised up to a substantially vertical position and then depositing a film on the substrate in the chamber.

In the above case, as shown in FIG. 12 that is a cross-sectional view, each pallet 100 is provided with a plurality of clamps 110 serving as engagement elements. The clamps 110 engage a peripheral region of a substrate 200 loaded at the specified position on the pallet 100, thereby holding the substrate 200 on the pallet 100.

Specifically, each clamp 110 pivots between an open position, as shown in FIG. 13(a) that is a partly enlarged cross-sectional view, in which it retracts outward (rightward in the figure) from the peripheral region of the substrate 200 and a closed position, as shown in FIG. 13(b), in which it engages a part of the peripheral region of the substrate 200 associated with the clamp 110.

Patent Document 1: Published Japanese Patent Application No. 2002-121663 (Pages 3 and 4 and FIG. 2)

DISCLOSURE OF THE INVENTION

Problem to be Solved by the Invention

According to such a palletizer as described above, as shown in the imaginary lines in FIG. 13, when a substrate 200 is loaded offset from the specified position on the pallet 100, a part of the peripheral region of the substrate 200 sometimes gets on one or some of the clamps 110.

In such a case in the prior art, if the substrate 200 can be held on the pallet 100 by other clamps 110, a specified process for the substrate 200 held on the pallet 100 will proceed as the position of the substrate 200 remains unchanged. Therefore, when the substrate 200 is transferred into a reaction chamber and the peripheral region of the substrate 200 is covered with a frame-shaped mask 300 in the reaction chamber, as shown in FIG. 14 that is a partly enlarged plan view, a problem may occur that the part of the peripheral region of the substrate 200 getting on the clamp 110 is sandwiched between the clamp 110 and the frame-shaped mask 300 and thereby cracks.

The present invention has been made in view of the foregoing and, therefore, its principal object is to provide a substrate holding device for holding a substrate loaded on a holder, such as a pallet, by engaging a peripheral region of the substrate with a plurality of engagement elements, whereby when the substrate is placed offset from a specified position on the holder and the peripheral region of the substrate gets on one or some of the engagement elements a specified process can be prevented from proceeding as the position of the substrate remains unchanged.

Means to Solve the Problem

To attain the above object, the present invention is configured so that the presence of a peripheral region of a substrate loaded on a holder can be detected over the entire periphery, whereby it can be determined whether the substrate is loaded on the specified position on the holder, or in other words whether the peripheral region of the substrate does not get on any clamp.

Specifically, an aspect of the present invention is directed to a substrate holding device comprising: a holder on which a substrate is to be loaded; a plurality of engagement elements arranged to lie aside of the periphery of the substrate when the substrate is placed at a specified position on the holder, the plurality of engagement elements being each provided to be engageable to a peripheral region of the substrate to hold the substrate on the holder; and an opening/closing mechanism for opening the plurality of engagement elements from their closed positions in which the engagement elements engage the peripheral region of the substrate placed at the specified position on the holder to their open positions in which the engagement elements retract outwardly away from the peripheral region of the substrate and closing the plurality of engagement elements from the open positions to the closed positions.

Furthermore, the substrate holding device also comprises: a plurality of detectors for detecting different associated parts of the peripheral region of the substrate placed at the specified position on the holder; and a determination unit for determining that the substrate is placed offset from the specified position on the holder when at least one of the plurality of detectors did not detect the associated part of the peripheral region of the substrate.

In the above configuration, the plurality of detectors may be arranged to detect their associated parts of the peripheral region of the substrate at a plurality of points for each side of the substrate.

Another aspect of the present invention is directed to a substrate processing system comprising: the substrate holding device of the above configuration; and a processing part for subjecting the substrate on the holder of the substrate holding device to a specified process. The substrate processing system further comprises: a raising/laying unit for raising the holder of the substrate holding device from a substantially horizontal lying position to a substantially vertical standing position and laying the holder from the standing position to the lying position; a loading unit for loading the substrate on the holder laid in the lying position by the raising/laying unit; a transfer unit for transferring through the processing part the holder on which the substrate is loaded by the loading unit and which is raised in the standing position by the raising/laying unit; and an unloading unit for unloading from the holder the substrate on the holder transferred by the transfer unit and having passed through the processing part.

In the above case, each detector may include a projection/receiving part for projecting a laser beam and receiving reflection of the laser beam to output a single corresponding to the amount of light received and a reflection part for reflecting the laser beam projected from the projection/receiving part towards the projection/receiving part, and one of the projection/receiving part and the reflection part may be disposed above the substrate placed on the holder and outwardly away from the periphery of the holder while the other may be disposed below the substrate placed on the holder so as to be covered with the peripheral region of the substrate.

Furthermore, in the case where the substrate has a translucency, the determination unit may be configured to determine that the substrate is offset if the rate of the amount of light received by the projection/receiving parts of the detectors to the amount of light projected by the projection/receiving parts is smaller than a predetermined value.

Furthermore, in the substrate processing system of the above configuration, the processing part may comprise a plurality of reaction chambers each provided to form a specified thin film on the substrate by sputtering, and the transfer unit may be configured to transfer the holder so that the holder sequentially passes through the plurality of reaction chambers. In other words, the substrate processing system may be a sputtering system.

Still another aspect of the present invention is directed to a liquid crystal display device including a pair of substrates and a liquid crystal layer interposed between the pair of substrates. In the liquid crystal display device, at least one of the pair of substrates has a specified thin film formed thereon by the sputtering system.

EFFECTS OF THE INVENTION

According to the present invention, in a substrate holding device in which an approximately rectangular substrate placed at a specified position on a holder in a substantially horizontal position is held to the holder by engaging the peripheral region of the substrate with a plurality of engagement elements, a plurality of detectors are provided for detecting the substrate at a plurality of points in the peripheral region of the substrate and the determination unit determines that the substrate is offset when at least one of the detectors did not detect the substrate. Therefore, it can be prevented that a specified process proceeds as the substrate remains offset from the specified position on the holder and its peripheral region remains getting on one or some of the engagement elements.

Thus, for example, in a sputtering system used to deposit a film on a substrate held on a holder with the peripheral region of the substrate covered by a frame-shaped mask in manufacturing a TFT array substrate to be integrated into a liquid crystal display device, there can be avoided a situation that a part of the peripheral region of the substrate getting on an engagement element is sandwiched between the engagement element and the mask and thereby cracks.

EXPLANATION OF REFERENCE CHARACTERS

10 load lock/unload lock chamber
12 first reaction chamber (processing part)
13 second reaction chamber (processing part)
14 third reaction chamber (processing part)
16 transfer mechanism (transfer unit)
30 pallet (holder)
32 clamp (engagement element)
40 raising/laying mechanism (raising/laying unit)
50 lift mechanism (loading unit, unloading unit)
60 transferor (loading unit, unloading unit)
70 coil tension spring (opening/closing mechanism)
71 opening cylinder (opening/closing mechanism)
80 detector sensor (detector)
80a projection/receiving part
80b reflection part
90 determination section (determination unit)
p glass substrate (substrate)

BEST MODE FOR CARRYING OUT THE INVENTION

An embodiment of the present invention will be described below with reference to the drawings.

Figure 1:
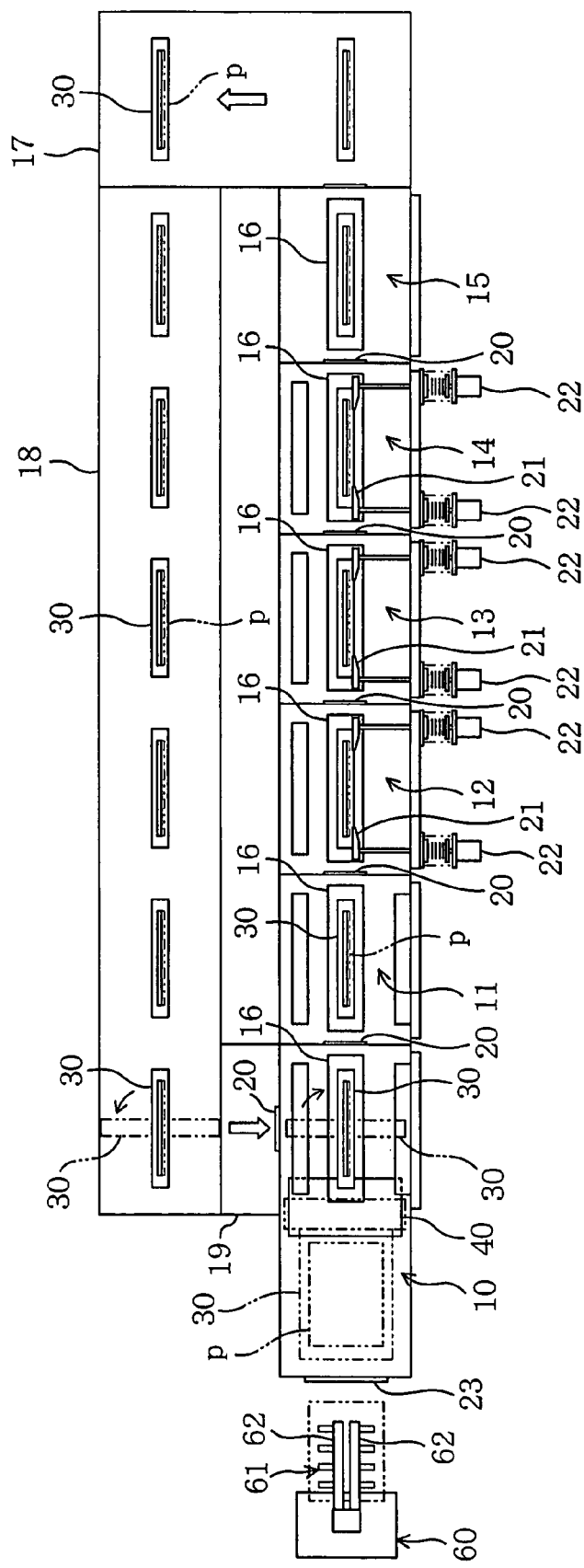
FIG. 1 is a plan view showing the overall structure of a sputtering system according to an embodiment of the present invention.
Figure 2:
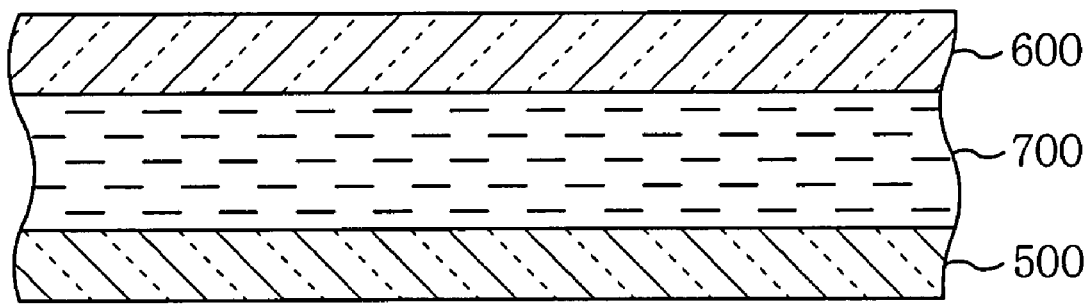
FIG. 2 is an enlarged cross-sectional view schematically showing the structure of a liquid crystal display device including a TFT array substrate on which a thin film is formed by the sputtering system.

FIG. 1 is a plan view schematically showing the overall structure of a sputtering system according to an embodiment of the present invention. The sputtering system is used, as schematically showing in FIG. 2 that is an enlarged cross-sectional view, in order to deposit a specified thin film on a large-size (e.g., 1500 mm×1800 mm) glass substrate p (hereinafter, referred to simply as a substrate p) in manufacturing a TFT array substrate 500 in a large-model liquid crystal display device in which a liquid crystal layer 700 is interposed between the TFT array substrate 500 and a CF substrate 600. Herein, the TFT array substrate 500 is formed so that a glass substrate cut in a given size includes a large number of TFTs (Thin Filmed Transistors) arrayed in a matrix thereon and the CF substrate 600 is formed so that a glass substrate similarly cut in a given size includes a color filter layer thereon.

The sputtering system includes a load lock/unload lock chamber 10 (hereinafter, referred to as an L/UL chamber) into which a substrate p carried in the sputtering system is led and out of which the substrate p is led, a heating chamber 11 for heating the substrate p, first to third reaction chambers 12 to 14 serving as three processing chambers each for depositing a specified thin film on the substrate p, and a complementary chamber 15 for accommodating the substrate p after subjected to a deposition process.

These chambers 10 to 15 are arranged linearly and gate valves 20 for closing the associated chambers 10 to 15 in airtight manner are provided between the adjacent chambers and in the complementary chamber 15.

The sputtering system also includes a plurality of pallets 30 serving as holders each provided to hold one substrate p and a transfer mechanism 16 for sequentially moving the pallets 30 in a line from the L/UL chamber 10 to the complementary chamber 15. In this embodiment, the sputtering system also includes a return conveyer 18 for sequentially moving the pallets 30 in a line in parallel with a path of transfer of the pallets 30 through the transfer mechanism 16 and in an opposite direction (leftward in FIG. 1) to the transfer direction (rightward in FIG. 1) of the transfer path, a first traverser 17 disposed between the complementary chamber 15 located at the downstream end of the transfer mechanism 16 and the upstream end of the return conveyer 18, and a second traverser 19 disposed between the downstream end of the return conveyer 18 and the L/UL chamber 10 located at the upstream end of the transfer mechanism 16. Thus, the sputtering system is configured to circularly move the plurality of pallets 30 in a single direction (counterclockwise in the shown example). The L/UL chamber 10 includes not only the gate valve 20 disposed between itself and the heating chamber 11 but also another gate valve 20 for passing a pallet 30 therethrough when the pallet 30 is moved into the L/UL chamber 10 by the second traverser 19. Although not shown, a rotating mechanism for rotating a pallet 30 by half a turn counterclockwise in FIG. 1 is provided at the downstream end of the return conveyer 18. Each pallet 30 is transferred, with its orientation changed by the rotating mechanism, via the gate valve 20 into the L/UL chamber 10.

Each of the first to third reaction chambers 12 to 14 is provided with a rectangular frame-shaped mask 21 capable of covering a peripheral region of the substrate p on the pallet 30 and a plurality of mask-specific cylinders 22 for moving the mask 21 forward to and backward away from the substrate p. When the pallets 30 holding substrates p are transferred to the respective reaction chambers 12 to 14, the plurality of mask-specific cylinders 22 for each reaction chamber 12 to 14 concurrently extend to cover the peripheral region of the substrate p on the pallet 30. When the deposition process in the reaction chambers 12 to 14 is finished, the plurality of mask-specific cylinders 22 concurrently retract to move the associated mask 21 away from the substrate p.

Figure 3:
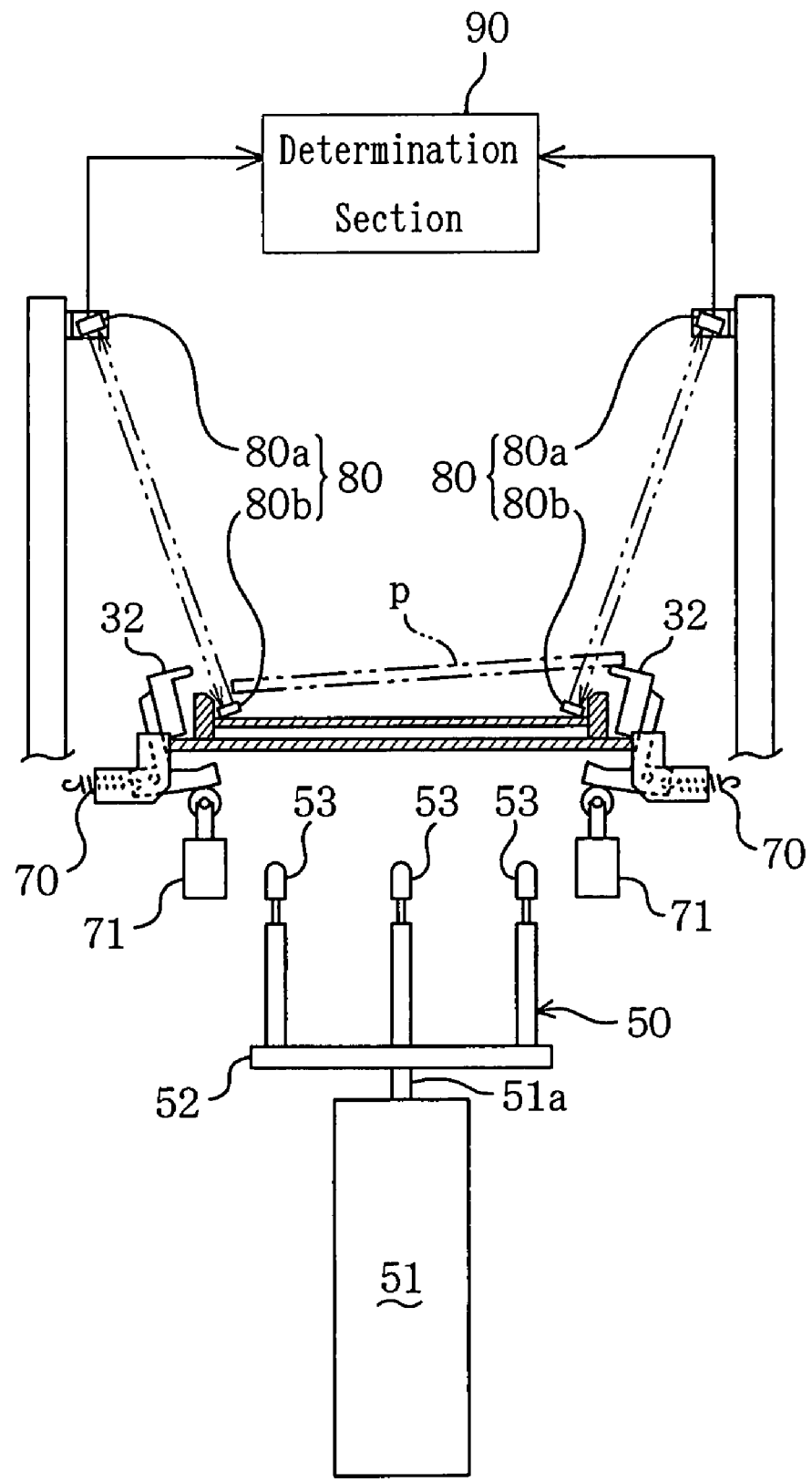
FIG. 3 is a cross-sectional view showing an essential part of the interior of an L/UL chamber of the sputtering system when viewed from a lead-in/lead-out gate valve.
Figure 4:
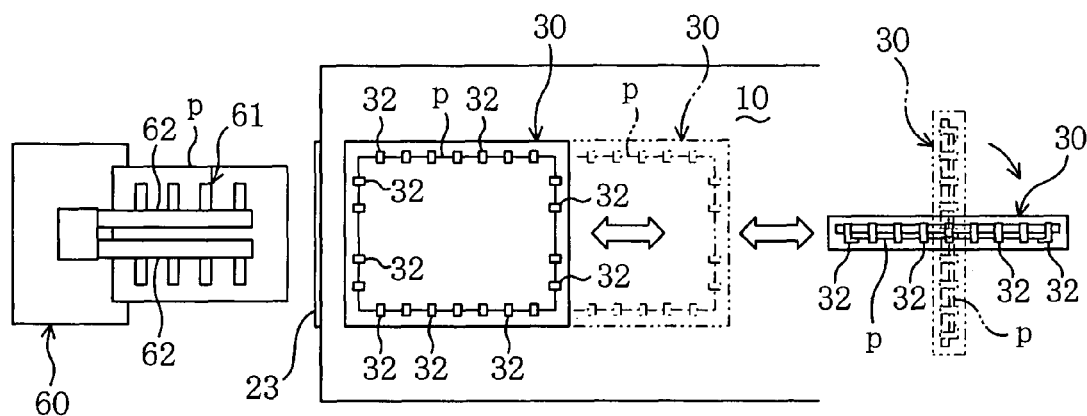
FIG. 4 is a side view schematically showing the raising, laying and rotation of a pallet in the L/UL chamber.
Figure 5:
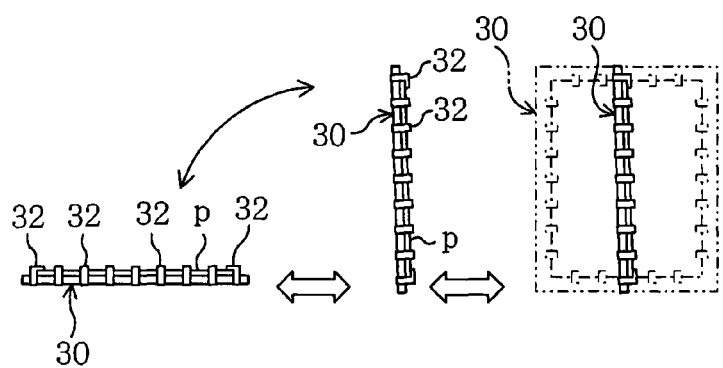
FIG. 5 is a plan view schematically showing the behavior of the pallet when the substrate is led in and out of the L/UL chamber.

The L/UL chamber 10 is provided with: a raising/laying mechanism 40 for raising a pallet 30 in the L/UL chamber 10 from a substantially horizontal lying position to a substantially vertical standing position and laying the pallet 30 from the standing position to the lying position (see FIG. 4 that is a side view); and a lift mechanism 50 for moving up and down the substrate p in a space located above the pallet 30 while supporting it from below when the pallet 30 is laid by the raising/laying mechanism 40 as shown in FIG. 3 that is a cross-sectional view as viewed from an after-mentioned lead-in/lead-out gate valve. The L/UL chamber 10 is also provided with the above-mentioned lead-in/lead-out gate valve 23 for allowing the substrate p to be led into and out of the L/UL chamber 10 therethrough. Disposed in front of the lead-in/lead-out gate valve 23 is a transferor 60 for leading a substrate p carried in the sputtering system into the L/UL chamber 10 and leading the substrate p after subjected to a deposition process out of the L/UL chamber 10 in order to carry it out of the system. Although not shown, a rotating mechanism for rotating a pallet 30 by half a turn clockwise in FIG. 1 is provided in the L/UL chamber 10 (see FIG. 4 and FIG. 5 that is a plan view). Each pallet 30 in the standing position is transferred, with its orientation changed by the rotating mechanism, into the heating chamber 11.

Although not shown, the raising/laying mechanism 40 includes a support for supporting a pallet 30 to permit the pallet 30 to stand and lie and a drive unit for raising and laying the pallet 30 supported by the support.

The lift mechanism 50 includes a lifting cylinder 51 disposed below and substantially in the middle of the pallet 30 in the lying position in the L/UL chamber 10 to extend a rod 51a upward and retract it downward. A horizontally disposed lift plate 52 is connected to the top end of the rod 51a to move up and down together with the rod 51a. A plurality of lift pins 53 stand from the top surface of the lift plate 52. When a substrate p is led by the transferor 60 into the L/UL chamber 10 with a pallet 30 in the lying position, the lifting cylinder 51 extends to support the substrate p on the transferor 60 with the lift pins 53 from below and receive it and then retracts to load the substrate p on the pallet 30. On the other hand, in unloading the substrate p on the pallet 30, the lifting cylinder 51 extends to move upward the substrate p on the pallet 30 and pass the substrate p to the transferor 60 and then retracts to evacuate the top ends of the lift pins 53 to below the pallet 30.

The transferor 60 includes a holding part 61 provided to hold a substrate p by supporting it from below and an upwardly and downwardly movable arm 62 provided to horizontally move the holding part 61. In leading the substrate p into the L/UL chamber 10, the transferor 60 is configured to horizontally move the holding part 61, with the arm 62 moved upward, to put the holding part 61 through the lead-in/lead-out gate valve 23 into the L/UL chamber 10 and then move the arm 62 downward to transfer the substrate p on the holding part 61 to the lift mechanism 50. In leading the substrate p out of the L/UL chamber 10, the transferor 60 is configured to horizontally move the holding part 61, with the arm 62 moved downward, to put the holding part 61 through the lead-in/lead-out gate valve 23 into the L/UL chamber 10 and then move the arm 62 downward to receive the substrate p from the lift mechanism 50. Thus, the raising/laying mechanism 40 constitutes a raising/laying unit according to the present invention and the lift mechanism 50 and the transferor 60 constitute a loading/unloading unit according to the present invention.

Each pallet 30 includes a receiver 31 formed of a rectangular frame. The receiver 31 is provided at the outsides with a plurality of clamps 32 for engaging the peripheral region of a substrate p on the pallet 30. Each clamp 32 is formed of an engagement part 32a of substantially L-shape and a support 32b of substantially L-shape integrally connected to the engagement part 32a to form substantially the letter U with the engagement part 32a. Each clamp 32 is pivotally supported through a pivot pin 34 to a bracket 33 mounted to the pallet 30.

A coil tension spring 70 is disposed between the pallet 30 and the support 32b of each clamp 32 to always urge the clamp 32 into pivotal movement towards its closed position.

In the L/UL chamber 10, opening cylinders 71 extendable to project their respective rods 71a upward stand below their respective associated clamps 32 of the pallet 30 laid down in the L/UL chamber 10. The rod 71a of each opening cylinder 71 is provided at the top end with a pressing roller 72 rotatable about an axis parallel to the pivot pin 34 of the associated clamp 32. When the opening cylinders 71 extend all together so that the pressing rollers 72 push their respective associated supports 32b of the clamps 32 upward, all the clamps 32 pivotally move from their closed positions to their open positions against bias forces of the coil tension springs 70. Thus, the coil tension springs 70 and the opening cylinders 71 constitute an opening/closing mechanism according to the present invention.

In this embodiment, as shown in FIG. 3, the sputtering system further includes; a plurality of detector sensors 80 provided in the L/UL chamber 10 to detect their associated parts of a peripheral region of the substrate p when the substrate p is placed at a specified position on the pallet 30; and a determination section 90 for determining that the substrate p is placed at the specified position when all the detector sensors 80 detected their associated parts but determining that the substrate p is not placed at the specified position on the pallet 30 when at least one detector sensor 80 did not detect its associated part.

Specifically, the detector sensors 80 are arranged a plurality for each of the four sides of a substrate p. Each detector sensor 80 includes: a projection/receiving part 80a for projecting a laser beam with a specified intensity (for example, a wavelength λ of 650 nm, a beam diameter φ of 1.5 mm and a light quantity Q of 3000 to 4500 lumens second) to its associated part of the peripheral region of the substrate p and receiving reflection of the laser beam to output a signal corresponding to the amount of light received; and a reflection part 80b for reflecting the laser beam projected from the associated projection/receiving part 80a towards the projection/receiving part 80a. If the substrate p is placed at the specified position on the pallet 30, laser beams from all the detector sensors 80 transmit through the substrate p both in outward and return paths and is thereby received in double-attenuated manner by the projection/receiving parts 80a. On the other hand, if the substrate p is placed offset on the pallet 30, a laser beam of the associated detector sensor 80 does not transmit through the substrate p both in outward and return paths and is thereby received by the projection/receiving parts 80a as it remains substantially unattenuated. Thus, the difference between the attenuation rate when the substrate p is detected and that when the substrate p is not detected increases, thereby providing facilitated and reliable determination.

The projection/receiving parts 80a are arranged, when a substrate p is placed on a pallet 30 in the lying position, so as to be located above the substrate p and outwardly away from the periphery of the pallet 30. The reflection parts 80b are arranged, at that time, so as to be located under the peripheral region of the substrate p. Thus, the optical axis between each projection/receiving part 80a and the associated reflection part 80b is set inclined to be away from the pallet 30 as it goes higher. Therefore, while the substrate p placed at the specified position on the pallet 30 can be appropriately supported at its peripheral region by the receiver 31, the peripheral region of the substrate p can be appropriately detected without being interfered with by the receiver 31. In addition, in spite of the pallet 30 being upsized with the increase in size of the substrate p, the projection/receiving parts 80a do not interfere with the raising and laying of the pallet 30. Note that the optical axis between the associated projection/receiving part 80a and reflection part 80b is set, if the substrate p is placed at the specified position on the pallet 30, to pass a certain distance (for example, approximately 3 mm) inwardly from the peripheral edges of the substrate p.

The determination section 90 calculates, based on the amount of light received output from each detector sensor 80, the attenuation rate τ of the amount of light received to the amount of light projected from the detector sensor 80 (={((amount of light projected)−(amount of light received))/ (amount of light projected)}×100) and determines, for example, if the attenuation rate τ is equal to or more than a predetermined value K (τ≧K (e.g., K≈10 to 20%), that the detector sensor 80 detected the substrate p. On the other hand, if the attenuation rate τ is less than the predetermined value K (τ<K), the determination section 90 determines that the detector sensor 80 did not detect the substrate p. Then, when all the detector sensors 80 detected the substrate p, the determination section 90 notifies the determination through a notification device such as a lamp. But, if there is at least one detector sensor 80 not detecting the substrate p, the determination section 90 determines that the substrate p is not placed at the specified position on the pallet 30, notifies the determination through a notification device, such as a lamp or buzzer, and outputs to a control section (not shown) of the sputtering system a signal for stopping the operation of the sputtering system.

Figure 6A:
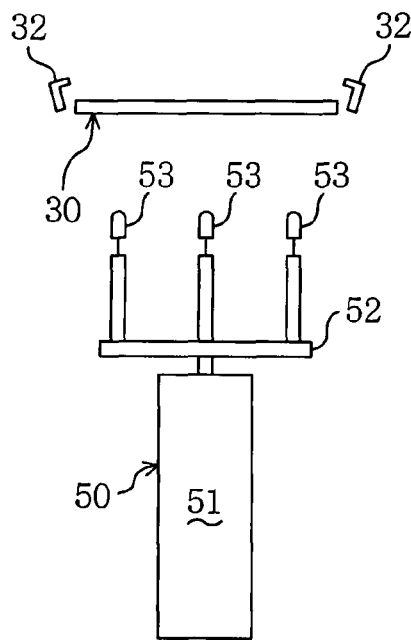
FIG. 6 is front views schematically showing the behaviors of a transferor, a lift mechanism and an opening/closing mechanism during loading of the substrate into the L/UL chamber by dividing the behaviors into four steps (a) to (d) and showing the components as cross sections of their essential parts.

A description is given now of the behavior of the sputtering system having the above configuration. In an initial state of the system, in the L/UL chamber 10, the pallet 30 is held in the lying position by the raising/laying mechanism 40 as schematically shown in FIG. 6(a) that is a front view, and the opening cylinders 71 retract so that all the clamps 32 is in their closed positions. In the lift mechanism 50, the lifting cylinder 51 retracts so that the lift pins 53 are located below the pallet 30. The substrate p carried in the sputtering system is held by the holding part 61 of the transferor 60 in the space outside of the L/UL chamber 10.

Figure 6B:
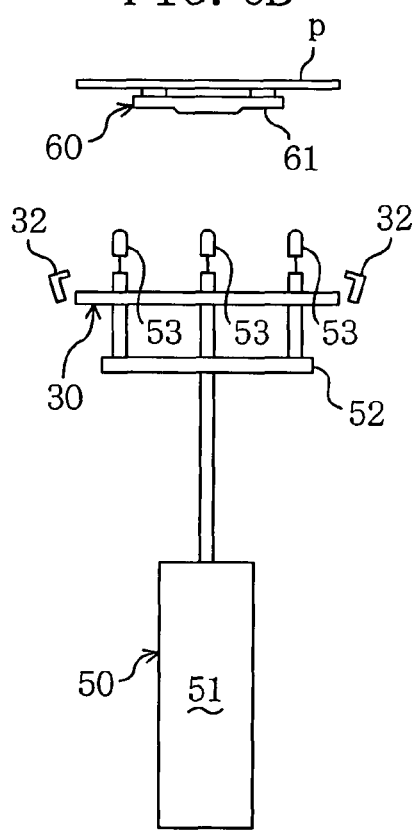

First, the opening cylinders 71 extend, whereby all the clamps 32 are positioned in their open positions. Furthermore, the lifting cylinder 51 of the lift mechanism 50 extends, whereby all the lift pins 53 upwardly pass through the pallet 30 and their top ends are positioned above the pallet 30. Then, when the lead-in/lead-out gate valve 23 is opened, the transferor 60 inserts the arm 62 through the lead-in/lead-out gate valve 23 into the L/UL chamber 10, and leads the substrate p into the L/UL chamber 10 as schematically shown in FIG. 6(b) that is a front view.

Figure 6C:
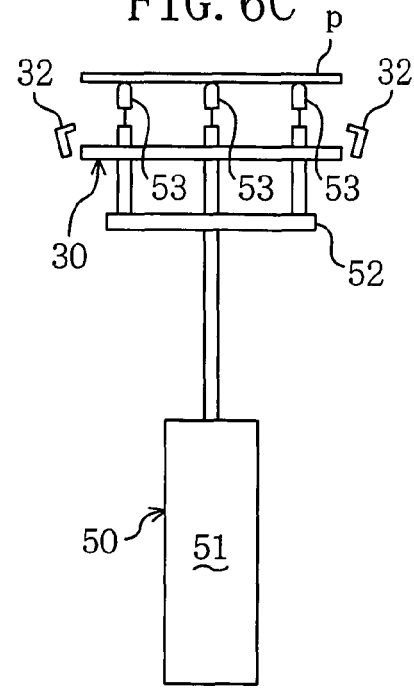

Next, the transferor 60 moves down the arm 62 to transfer the substrate p on the holding part 61 onto the lift pins 53 of the lift mechanism 50 (see FIG. 6(c) that is a font view) and pulls out the arm 62 from the interior of the L/UL chamber 10. Then, the lead-in/lead-out gate valve 23 closes and the interior of the L/UL chamber 10 is reduced in pressure. Furthermore, the lifting cylinder 51 of the lift mechanism 50 retracts, whereby the lift pins 53 are moved down to below the pallet 30. Thus, the substrate p on the lift pins 53 is loaded on the pallet 30.

Figure 6D:
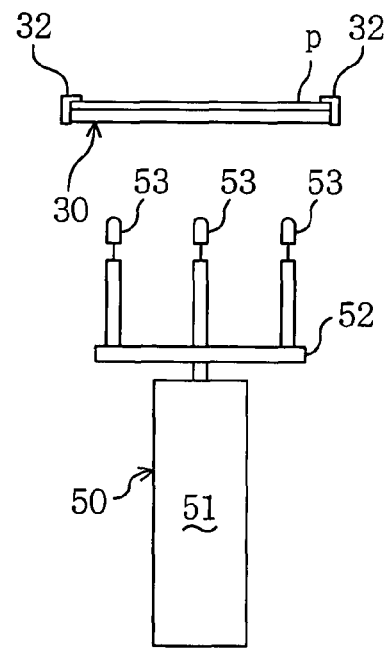

When the substrate p is loaded on the pallet 30, the detector sensors 80 begin the detection of the associated parts of the peripheral region of the substrate p. Then, when at least one of all the detector sensors 80 did not detect its associated part of the substrate p, the determination section 90 determines, based on the output signal from that detector sensor 80, that the substrate p is placed offset from the specified position. In other words, this means that the part of the substrate p associated with that detector sensor 80 is offset towards the detector sensor 80. In contrast, when all the detector sensors 80 detected their associated parts of the substrate p, the determination section 90 determines that the substrate p is placed at the specified position. Then, the opening cylinders 71 retract, whereby all the clamps 32 pivotally move to their closed positions. Thus, the substrate p is held on the pallet 30 by the clamps 32 with its peripheral region not getting on any clamp 32 as schematically shown in FIG. 6(d) that is a front view.

If it was determined that the substrate p is placed at the specified position, the raising/laying mechanism 40 operates to raise the pallet 30 and the transfer mechanism 16 operates to send the pallet 30 first to the heating chamber 11, then the first reaction chamber 12, the second reaction chamber 13 and then the third reaction chamber 14 to pass through them in this order. In each of the first to third reaction chambers 12 to 14, the mask-specific cylinders 22 extend to move the mask 21 towards the pallet 30 and cover the peripheral region of the substrate p on the pallet 30. In this case, since the peripheral region of the substrate p does not get on any clamp 32, there can be avoided the occurrence of a situation that a part of the peripheral region of the substrate p is sandwiched between the mask 21 and the clamp 32 and thereby cracks.

Each substrate p subjected to specified deposition processes in the first to third reaction chambers 12 to 14 reaches the complementary chamber 15 as it remains held on the pallet 30. Then, the first traverser 17, the return conveyer 18 and the second traverser 19 operate to return the substrate p to the L/UL chamber 10 and the raising/laying mechanism 40 then turns down the substrate p about the lower side of the standing position to lay it into a substantially horizontal position. In the lift mechanism 50, the lifting cylinder 51 extends, whereby the lift pins 53 move up to lift the substrate p on the pallet 30 to a specified level. Then, the lead-in/lead-out gate valve 23 opens, the transferor 60 inserts the arm 62 into the L/UL chamber 10 and holds the substrate p on the holding part 61 in lieu of the lift pins 53. Thereafter, the transferor 60 pulls out the arm 62 from the L/UL chamber 10 and stands by for a carry-out to the next process.

According to this embodiment, in the sputtering system in which an approximately rectangular substrate p placed at a specified position on a pallet 30 in a substantially horizontal position is held on the pallet 30 by engaging a peripheral region of the substrate p with a plurality of clamps 32 and a specified thin film is formed on the substrate p while the pallet 30 is circularly moved, a plurality of detector sensors 80 are provided for detecting the substrate p at a plurality of points in the peripheral region of the substrate p and the determination section 90 determines that the substrate p is offset when at least one of the detector sensors 80 cannot detect the substrate p. Therefore, there can be prevented the occurrence of a situation that a specified process proceeds as the substrate p remains offset from the specified position on the pallet 30 and its peripheral region remains getting on one or some of the clamps 32.

Thus, in subjecting a substrate p held on a pallet 30 to a deposition process with its peripheral region covered with a frame-shaped mask 21 in manufacturing a TFT array substrate for a liquid crystal display device, there can be avoided the occurrence of a situation that the peripheral region of the substrate p getting on the clamp 32 is sandwiched between the clamp 32 and the mask 21 and thereby cracks.

Figure 7:
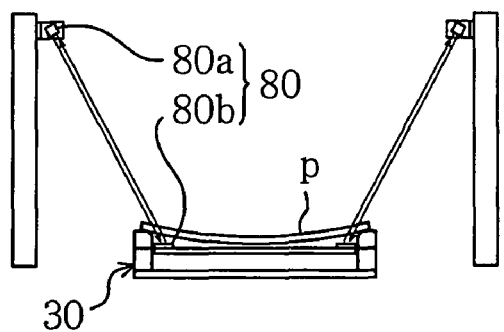
FIG. 7 is a front view schematically showing the cross section of an essential part of Modification 1 of the embodiment.

In the above embodiment, the reflection part 80b of the detector sensor 80 is disposed at right angles to the optical axis between the reflection part 80b and the associated projection/receiving part 80a. However, if a required amount of light received for detection is ensured, the reflection part 80b may be disposed inclined from right angles to the optical axis as shown as Modification 1 in FIG. 7 that is a front view.

Figure 8:
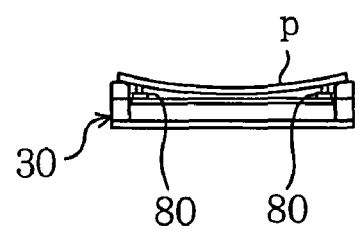
FIG. 8 is a corresponding view of FIG. 7, schematically showing the cross section of an essential part of Modification 2 of the embodiment.
Figure 9:
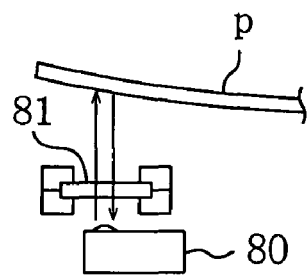
FIG. 9 is an enlarged front view schematically showing the essential part of Modification 2.

Although in the above embodiment the projection/receiving parts 80a are arranged above the substrate p, they may be arranged below the substrate p as shown as Modification 2 in FIG. 8 that is a front view and FIG. 9 that is an enlarged plan view of an essential part. In this case, since the distance between the projection/receiving part 80a and the substrate p is short, the substrate p may be used as a reflection part if the required amount of light received is ensured. Furthermore, in this case, in order to prevent the projection/receiving surface of the projection/receiving part 80a from being directly contaminated with dusts, a transparent inspection window 81 may be disposed in front of the projection/receiving part 80a.

Figure 10:
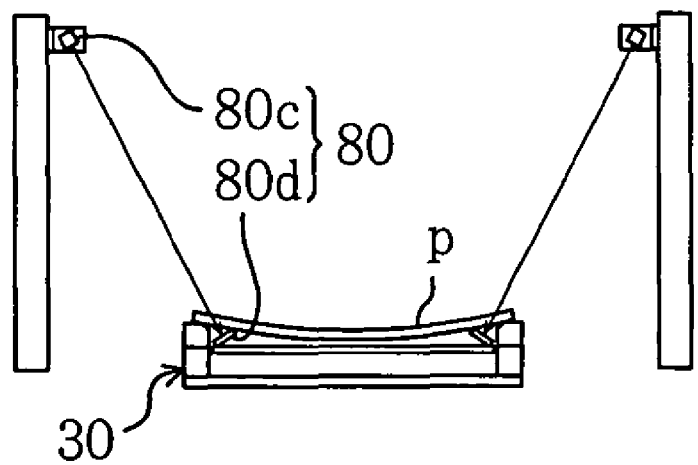
FIG. 10 is a corresponding view of FIG. 7, schematically showing the cross section of an essential part of Modification 3 of the embodiment.
Figure 11:
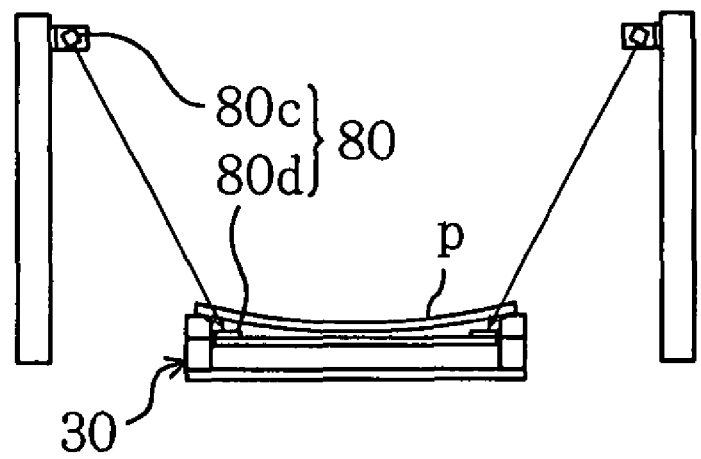
FIG. 11 is a corresponding view of FIG. 7, schematically showing the cross section of an essential part of Modification 4 of the embodiment.
Figure 12:
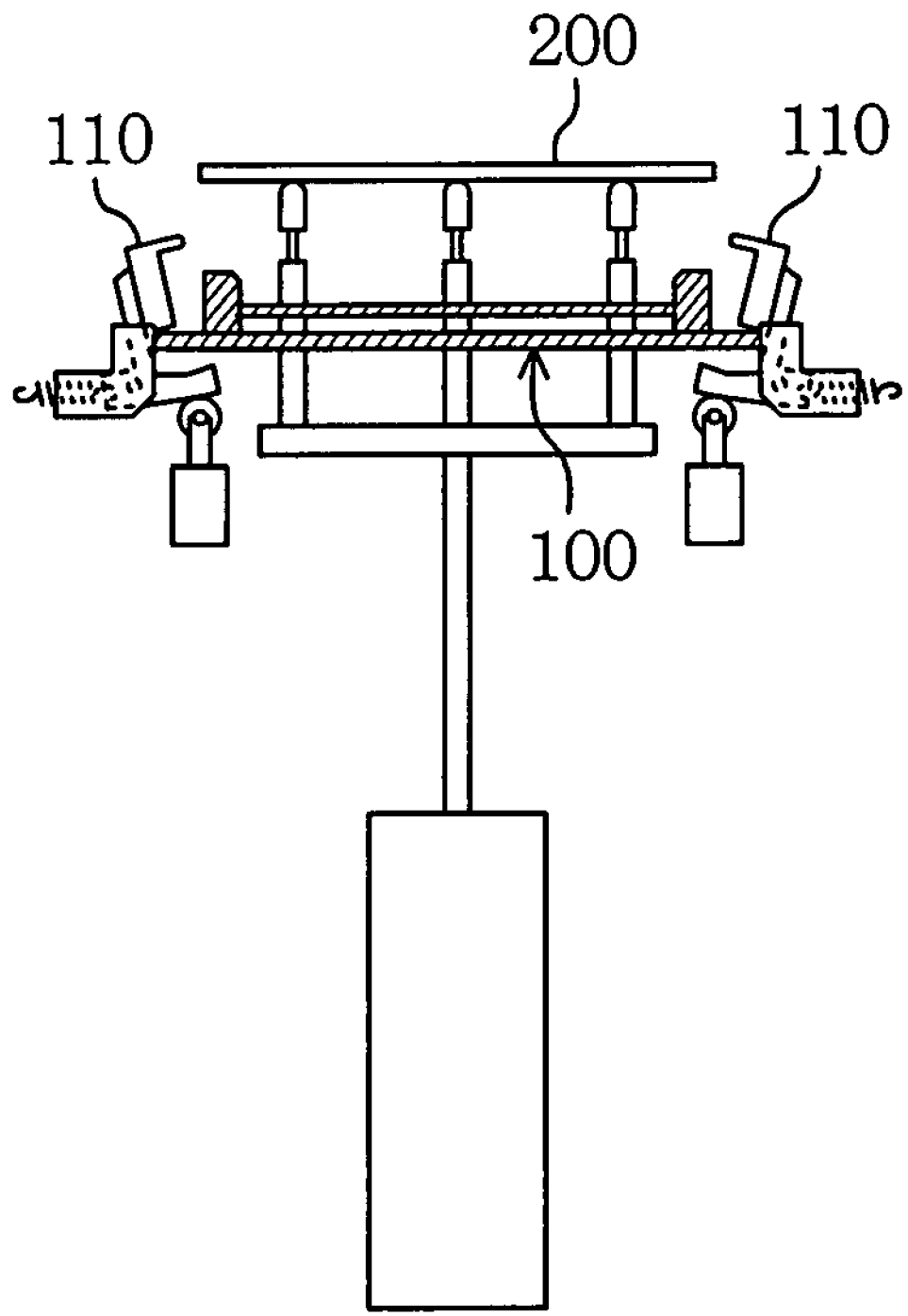
FIG. 12 is a corresponding view of FIG. 3, showing the internal structure of an L/UL chamber of a conventional sputtering system.
Figure 13A:
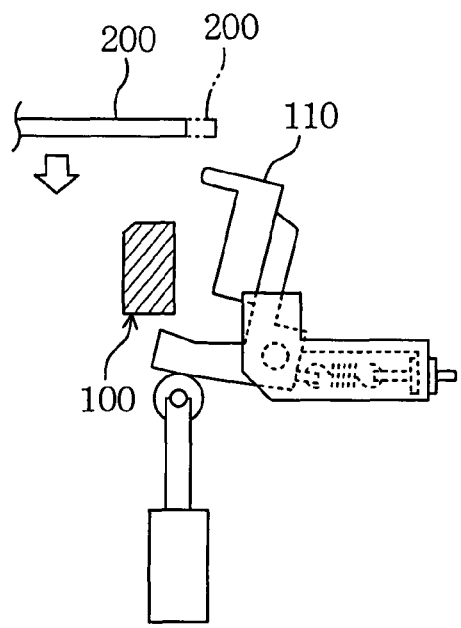
FIG. 13 is partly enlarged cross-sectional views showing (a) when a substrate is loaded offset on a pallet and (b) when the substrate gets on a clamp.
Figure 13B:
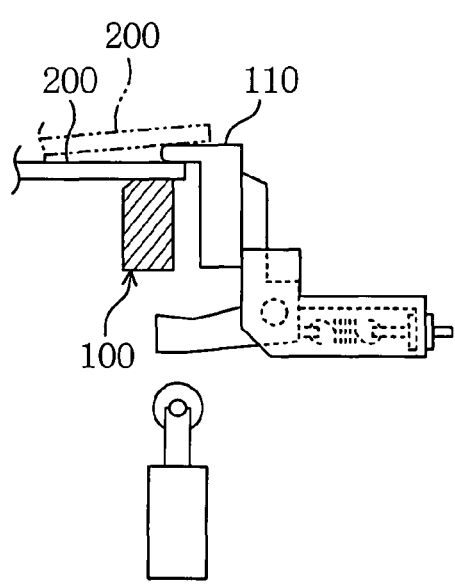
Figure 14:
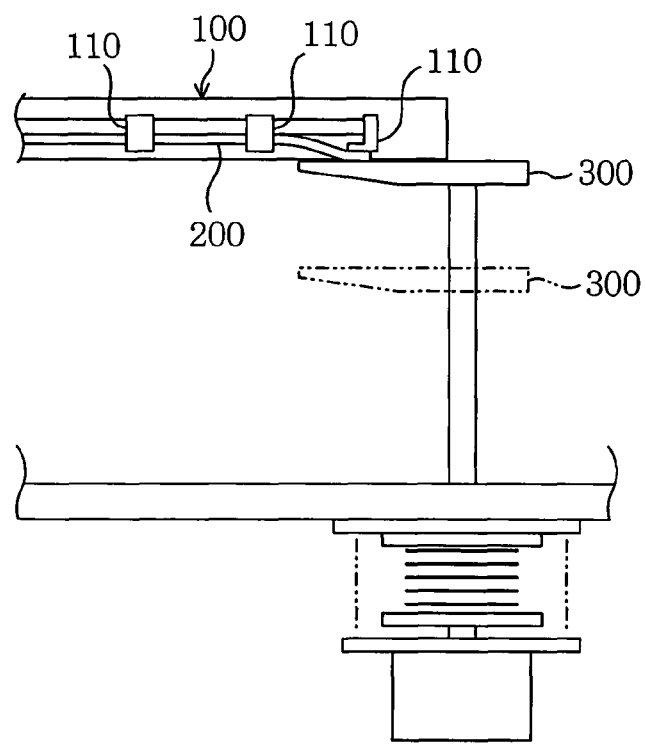
FIG. 14 is a partly enlarged plan view showing when the substrate getting on the clamp is pressed against a mask in a reaction chamber.

For a detector sensor 80 according to the present invention including a projection part and a receiving part, the above embodiment employs an integral type one in which the projection part and the receiving part are integrally constructed. Alternatively, a separate type detector sensor 80 may be used in which a projection part 80c and a receiving part 80d are separated from each other as shown as Modification 3 in FIG. 10 that is a front view. In this case, as shown in FIG. 10, the receiving part 80d is preferably disposed at right angles to the optical axis between the receiving part 80d and the projection part 80c. However, if the required amount of light received is ensured, the receiving part 80d may be disposed inclined from right angles to the optical axis as shown as Modification 4 in FIG. 11 that is a front view.

Although in the above embodiment the pallet 30 is raised and laid, the present invention is also applicable to the case where the pallet 30 is used while keeping a substantially horizontal position.

Although in the above embodiment the L/UL chamber 10 is configured so that the load lock chamber also acts as an unload lock chamber, an exclusive unload lock chamber may be disposed separately from the load lock chamber. In this case, however, it is necessary to provide an additional transferor for the unload lock chamber in addition to a transferor for the load lock chamber.

Although the above embodiment describes a sputtering system used in manufacturing a TFT array substrate 500 for a liquid crystal display device, the present invention is applicable to various types of substrate processing systems.

The invention claimed is:

1. A substrate holding device comprising:
a holder on which a substrate is to be loaded;
a plurality of engagement elements arranged to lie aside of the periphery of the substrate when the substrate is placed at a specified position on the holder, the plurality of engagement elements being each provided to be engageable to a peripheral region of the substrate to hold the substrate on the holder;
an opening/closing mechanism for opening the plurality of engagement elements from their closed positions in which the engagement elements engage the peripheral region of the substrate placed at the specified position on the holder to their open positions in which the engagement elements retract outwardly away from the peripheral region of the substrate and closing the plurality of engagement elements from the open positions to the closed positions;
a plurality of detectors for detecting different associated parts of the peripheral region of the substrate placed at the specified position on the holder; and
a determination unit for determining that the substrate is placed offset from the specified position on the holder when at least one of the plurality of detectors did not detect the associated part of the peripheral region of the substrate.

2. The substrate holding device of claim 1, wherein
the substrate has a substantially rectangular shape having four sides, and
the plurality of detectors are arranged to detect their associated parts of the peripheral region of the substrate at a plurality of points for each side of the substrate.

3. A substrate processing system comprising:
the substrate holding device according to claim 1;
a processing part for subjecting the substrate held on the holder of the substrate holding device to a specified process;
the holder of the substrate holding device being capable of being raised from a substantially horizontal lying position to a substantially vertical standing position and being laid from the standing position to the lying position;
a raising/laying unit for raising the holder from the lying position to the standing position and laying the holder from the standing position to the lying position;
a loading unit for loading the substrate on the holder laid in the lying position by the raising/laying unit;
a transfer unit for transferring through the processing part the holder on which the substrate is loaded by the loading unit and which is raised in the standing position by the raising/laying unit; and
an unloading unit for unloading from the holder the substrate on the holder transferred by the transfer unit and having passed through the processing part.

4. The substrate processing system of claim 3, wherein
each said detector includes a projection/receiving part for projecting a laser beam and receiving reflection of the laser beam to output a single corresponding to the amount of light received and a reflection part for reflecting the laser beam projected from the projection/receiving part towards the projection/receiving part, and
one of the projection/receiving part and the reflection part is disposed above the substrate placed on the holder in the lying position and outwardly away from the periphery of the holder while the other is disposed below the substrate placed on the holder in the lying position so as to be covered with the peripheral region of the substrate.

5. The substrate processing system of claim 4, wherein
the substrate has a translucency, and
the determination unit is configured to determine that the substrate is offset if the rate an attenuation rate of the amount of light received by the projection/receiving parts of the detectors to the amount of light projected by the projection/receiving parts is smaller than a predetermined value.

6. The substrate processing system of claim 3, wherein
the processing part comprises a plurality of reaction chambers each provided to form a specified thin film on the substrate by sputtering, and
the transfer unit is configured to transfer the holder so that the holder sequentially passes through the plurality of reaction chambers.

* * * * *